(12) United States Patent
Sutardja et al.

(10) Patent No.: US 8,609,528 B1
(45) Date of Patent: *Dec. 17, 2013

(54) HIGH-DENSITY PATTERNING

(75) Inventors: Pantas Sutardja, Los Gatos, CA (US);
Albert Wu, Palo Alto, CA (US);
Winston Lee, Palo Alto, CA (US); Peter Lee, Fremont, CA (US); Chien-Chuan Wei, Sunnyvale, CA (US); Runzi Chang, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/204,370

(22) Filed: Aug. 5, 2011

Related U.S. Application Data

(63) Continuation of application No. 12/045,528, filed on Mar. 10, 2008, now Pat. No. 7,994,052.

(60) Provisional application No. 60/893,793, filed on Mar. 8, 2007.

(51) Int. Cl.
*H01L 21/4763* (2006.01)

(52) U.S. Cl.
USPC ........... 438/618; 438/622; 438/624; 438/625; 438/626; 438/627; 438/628

(58) Field of Classification Search
None
See application file for complete search history.

(56) References Cited

U.S. PATENT DOCUMENTS

| 7,273,812 B2 | 9/2007 | Kim et al. |
| 7,994,052 B1* | 8/2011 | Sutardja et al. ............... 438/669 |
| 2003/0027386 A1* | 2/2003 | Lee .............................. 438/253 |
| 2003/0203284 A1 | 10/2003 | Iriguchi et al. |

OTHER PUBLICATIONS

Wolf et al., Silicon Processing for the VLSI Era, vol. 1, 1986, p. 407-409, 427-429, 434-437, 452-454.*

* cited by examiner

*Primary Examiner* — Duy Deo

(57) ABSTRACT

Methods for patterning high-density features are described herein. Embodiments of the present invention provide a method comprising patterning a first subset of a pattern, the first subset configured to form a plurality of lines over the substrate, and patterning a second subset of the pattern, the second subset configured to form a plurality of islands over the substrate, wherein said patterning the first subset and said patterning the second subset comprise at least two separate patterning operations.

10 Claims, 7 Drawing Sheets

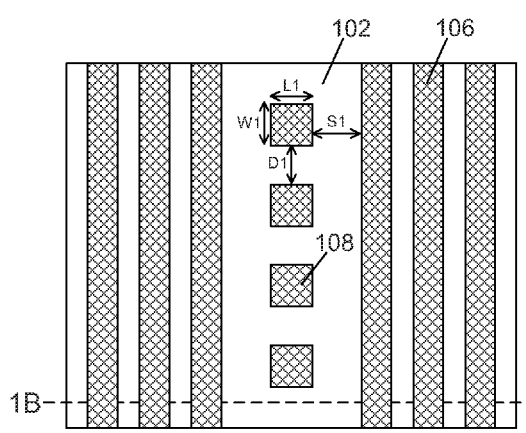
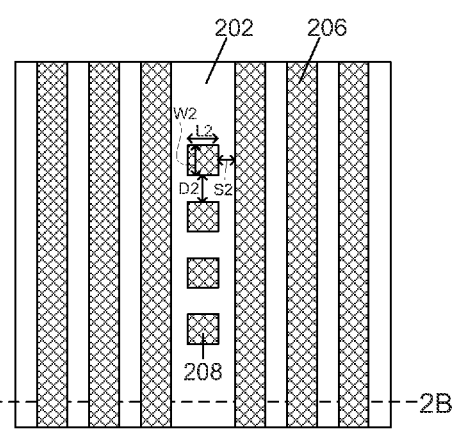
FIGURE 1A
(Prior Art)
FIGURE 2A
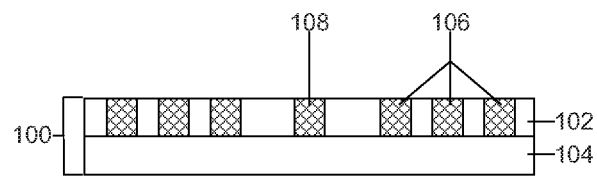
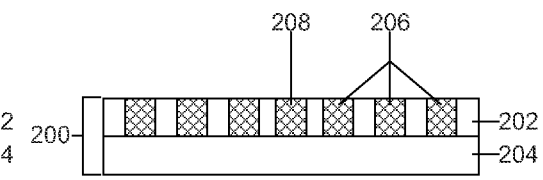
FIGURE 1B
(Prior Art)
FIGURE 2B

HIGH-DENSITY PATTERNING

CROSS-REFERENCE TO RELATED APPLICATIONS

The present application is a continuation of U.S. application Ser. No. 12/045,528, filed Mar. 10, 2008, which claims priority to U.S. Provisional Patent Application No. 60/893,793, filed Mar. 8, 2007, entitled "Novel Litho Process to Pattern High Density Metal for Advanced Silicon Process Technology," the entire disclosures of which are hereby incorporated by reference in its entirety.

TECHNICAL FIELD

Embodiments of the present invention relate to the field of microelectronic device fabrication, in particular, to patterning high-density features.

BACKGROUND

The demand for increasingly smaller devices has posed a number of challenges at least in terms of manufacturing, particular to the various photolithographic operations generally needed for patterning high-density features. Forming high-density metal lines and islands for memory devices, for example, may be limited by the optical resolution capabilities of photolithographic exposure tools. Although there exist advanced photolithography tools that employ reduced wavelengths and have high numerical aperture values, these factors may still be insufficient to effect onto a photoresist layer the required exposure for producing the desired feature density and/or size. Accordingly, effectively patterning high-density and high aspect ratio features is of substantial importance.

SUMMARY OF THE INVENTION

In view of the problems in the state of the art, embodiments of the invention are directed to methods for forming high-density features such as, for example, metal islands and lines. More specifically, with the foregoing and other items in view, there is provided, in accordance with various embodiments of the invention, a method comprising depositing a photoresist material over a substrate; patterning the photoresist material with a first subset of a pattern, the first subset configured to form a plurality of lines over the substrate; and patterning the photoresist material with a second subset of the pattern, the second subset configured to form a plurality of islands over the substrate; wherein said patterning the first subset and said patterning the second subset comprise at least two separate patterning operations.

In various embodiments, patterning the first subset may comprise exposing the photoresist material using a first mask configured to pattern the first subset. Similarly, in various embodiments, patterning the second subset may comprise exposing the photoresist material using a second mask configured to pattern the second subset.

In some embodiments, patterning the first subset may comprise removing the photoresist material at a first plurality of locations corresponding to the plurality of lines. Patterning the second subset may similarly comprise removing the photoresist material at a second plurality of locations corresponding to the plurality of islands.

In various embodiments, the substrate may include a dielectric layer formed thereover. In some of these embodiments, removing the photoresist material at the first plurality of locations and the second plurality of locations may comprise revealing the dielectric layer at the first plurality of locations and the second plurality of locations. In some embodiments, the revealed dielectric may be etched at the first plurality of locations to form a corresponding first plurality of openings. Similarly, in various embodiments, the revealed dielectric may be etched at the second plurality of locations to form a corresponding second plurality of openings.

In various embodiments, a metal layer may be deposited over the substrate to form the plurality of lines corresponding to the first subset and the plurality of islands corresponding to the second subset. The metal layer may be chemically and mechanically planarized in some embodiments.

In various embodiments, the substrate may include includes an etch stop layer and a dielectric layer formed over the etch stop layer. In various ones of these embodiments, the etch stop layer may be removed at locations corresponding to the first subset and the second subset.

In various embodiments, the substrate may comprise a memory device including a plurality of memory cells. The plurality of memory cells may be electrically coupled to one or more of at least one of the plurality of lines and at least one the plurality of islands.

Another method may comprise patterning a photoresist material with a first pattern and forming a plurality of first device features at locations corresponding to the first pattern, and after said forming the first device features, patterning the photoresist material with a second pattern, and forming a plurality of first device features at locations corresponding to a first pattern.

In various embodiments, the photoresist material may be formed over a device layer, and the plurality of first openings in the device layer may be formed at the locations corresponding to the first pattern. Similarly, a plurality of second openings in the device layer may be formed at the locations corresponding to the second pattern after said forming the plurality of second openings.

Forming the plurality of first device features may comprise, in various embodiments, depositing a first metal in the first openings. Similarly, in various embodiments, forming the plurality of second device features may comprise depositing a second metal in the second openings. First and/or second metal may be chemically and mechanically planarized. In some of these embodiments, the first metal may be planarized before said patterning the photoresist material with the second pattern.

In various embodiments, the first device features may comprise a selected one of a plurality of lines and a plurality of islands, and said second device features may comprise the non-selected one of the plurality of lines and the plurality of islands.

In various embodiments, the photoresist material may be formed over a plurality of memory cells, and the memory cells may be electrically coupled with the first device features and the second device features.

Other features that are considered as characteristic for embodiments of the invention are set forth in the appended claims.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIG. 1A illustrates a top view of a prior art microelectronic device including a plurality of lines and islands, and FIG. 1B illustrates a cross-sectional side view of the microelectronic device of FIG. 1A.

FIG. 2A illustrates a top view of a microelectronic device including a plurality of lines and islands having a reduced island size and reduced pitch between the islands and between the islands and the lines, relative to the microelectronic device of FIGS. 1A-1B, and FIG. 2B illustrates a cross-sectional side view of the microelectronic device of FIG. 2A.

DETAILED DESCRIPTION OF EMBODIMENTS OF THE INVENTION

Figure 3A:
FIGS. 3A-3G illustrate various stages of a method for forming high-density features in accordance with various embodiments of the present invention.

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous. The phrase "A/B" means A or B. For the purposes of the present invention, the phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

The terms chip, die, integrated circuit, monolithic device, semiconductor device, and microelectronic device are often used interchangeably in the microelectronics field. The present invention is applicable to all of the above as they are generally understood in the field.

Various embodiments of the present invention are directed to methods for patterning high-density features such as, for example, lines and islands of a memory device. Methods, and devices formed therefrom, may provide reduction in size and/or pitch of various features. For example, according to various embodiments, metal islands may be formed having a reduced size, pitch and spacing between the metal islands and metal lines relative to various prior art devices.

For example, illustrated in FIGS. 1A-1B is a prior art microelectronic device 100 including a dielectric layer 102 formed over a substrate 104. A number of device features may be formed in dielectric layer 102. Device features may include, for example, a plurality of lines 106 and a plurality of islands 108. As illustrated, islands 108 may have a width of W1, a length of L1, a pitch between islands 108 of D1, and a spacing between islands 108 and lines 106 of S1. Reduction of one or more of these feature sizes (W1, L1, D1, S1) may be hindered by light scattering/diffraction during patterning of lines 106 and islands 108, particularly with the use of smaller wavelengths. Thus, in some devices, one or more of the features' sizes have to be greater than the minimum printable feature size achievable by a process and/or toolset, for example, in order to achieve optical proximity correction, and/or uniformity of lithography and/or etch.

According to various embodiments of the invention, however, reduced feature sizes may be achieved. Illustrated in FIGS. 2A-2B is an exemplary microelectronic device 200 including a plurality of lines 206 and a plurality of islands 208 formed in a dielectric layer 202, dielectric layer 202 formed over a substrate 204. As illustrated, islands 208 may have a width of W2, a length of L2, a pitch between islands 208 of D2, and a spacing between islands 208 and lines 206 of S2. One or more of the feature size (W2, L2, D2, S2) may be reduced relative to various prior art devices including, for example, microelectronic device 100 of FIGS. 1A-1B. For example, in some embodiments, W2<W1, L2<L1, D2<D1, and S2<S1.

Reduced feature size may be achieved, according to various embodiments, by patterning a first subset of a pattern, the first subset configured to form a plurality of lines over the substrate, and patterning a second subset of the pattern, the second subset configured to form a plurality of islands over the substrate, wherein said patterning the first subset and said patterning the second subset comprise at least two separate patterning operations. Separating the patterning operations may avoid light scattering/diffraction that is known to occur during patterning of lines and islands, particularly with the use of smaller wavelengths. Accordingly, high-density features may be achieved.

Illustrated in FIGS. 3A-3G are cross-sectional views of a microelectronic device 300 after various operations associated with forming high-density lines and islands. In various embodiments and as illustrated at FIG. 3A, a dielectric layer 302 may be formed over a substrate 304. Between dielectric layer 302 and substrate 304 there may be an etch stop layer 306.

Substrate 304 used for various embodiments of the present invention may be any suitable substrate including, for example, silicon, geranium, gallium arsenide, and the like. Likewise, dielectric layer 302 for various embodiments described herein may be formed with any dielectric material suitable for the purpose including, for example, oxide, polyimide, or the like. In some embodiments, dielectric layer 302 may be an interlayer dielectric layer. It is noted that although dielectric layer 302 is illustrated being formed directly on etch stop layer 306 and etch stop layer 306 formed directly on substrate 304, one or more device layers may intervene the layers, depending on the application. For clarity, however, dielectric layer 102 is illustrated as being directly on substrate 104.

A photoresist layer 308 may be formed over the dielectric layer 302. Photoresist layer 308 may be patterned with a first pattern configured to form a plurality of lines. Dielectric layer 302 may be revealed at locations corresponding to locations whereat the plurality of lines may be later formed. For example, the revealed portions may correspond to locations of lines 206 illustrated in FIGS. 2A and 2B.

Figure 3B:
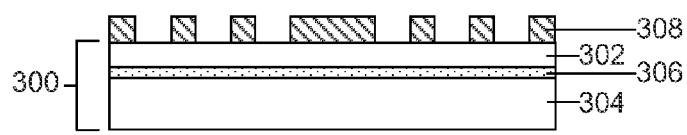
Figure 3C:
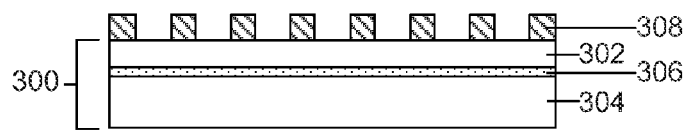

As illustrated in FIG. 3C, photoresist layer 308 may then be patterned with a second pattern configured to form a plurality of islands, in a patterning operation separate from the patterning operation illustrated in FIG. 3B. Dielectric layer 302 may be revealed at locations corresponding to locations whereat the plurality of islands may be later formed. For example, the revealed portions may correspond to locations of islands 208 illustrated in FIGS. 2A and 2B.

The first pattern configured to form the plurality of lines and the second pattern configured to form the plurality of islands may each be subsets of a final pattern comprising the plurality of lines and the plurality of islands. In some embodiments, the final pattern may comprise further subsets of patterns, and in these embodiments, each subset may be patterned separately to achieve the reduced feature sizes and/or pitches. Further, the subsets may be patterned in any order. So, in some embodiments, the subset configured to form the plurality of islands may be patterned prior to the patterning the subset configured to form the plurality of lines.

A photoresist material suitable for forming photoresist layers described herein may be any radiation-sensitive material suitable for the purpose. Photoresist layers may be formed from a positive photoresist or a negative photoresist, depending on the application, and embodiments of the present invention are applicable to both. For the various embodiments described herein, positive photoresists are illustrated for simplicity. Further, photoresist materials used for forming photoresist layers for any one or more of various operations described herein may be exposed to any radiation, and for any amount of time, suitable to cause the photoresist material to be removable, at the exposed locations (or unexposed locations with negative photoresist), during a develop operation.

According to various embodiments, patterning photoresist layer 308 to form the lines and the islands may comprise exposing the photoresist layer 308 using a first mask and a second mask (not illustrated) configured to pattern the first subset and the second set, respectively, of the final pattern. "Masking" as described herein may refer to the use of a mask, or similar patterning apparatus, such as, for example, a reticle. "Masking" or "mask" as used herein may also encompass maskless systems, wherein suitable light is projected onto a surface in the desired pattern. In various embodiments, patterning photoresist layer 308 may include, after exposure, one or more development operations for removing the exposed locations of photoresist layer 308 (or unexposed locations for negative photoresist).

Although FIGS. 3B and 3C depict separate patterning operations, with the first pattern (corresponding to the lines) being developed first and the second pattern corresponding to the islands) being developed second, various ones of the operations may be performed in another order or may be combined into fewer operations. For example, photoresist layer 308 may be exposed with the first pattern, then exposed with the second pattern, and then may be developed by simultaneously removing the exposed locations. In general, however, the exposure operations for forming the lines and the islands are separate operations to achieve the reduced feature sizes and/or pitches are described herein.

Figure 3D:
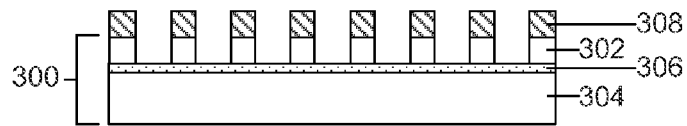

As illustrated in FIG. 3D, dielectric layer 302 may be etched at locations revealed by the first patterning and the second patterning, to expose etch stop layer 306 at locations corresponding thereto. The revealed dielectric layer 302 may be etched in separate operations after each patterning operation or may be performed substantially simultaneously after the patterning operations. For example, revealed portions of dielectric layer 302 may be etched after patterning the first pattern and prior to patterning the second pattern, or alternatively, substantially simultaneously after patterning both first and second patterns.

Figure 3E:
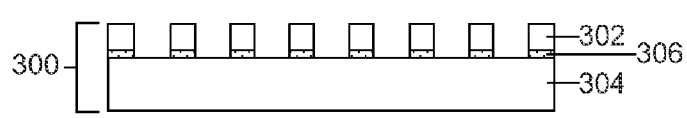
Figure 3F:
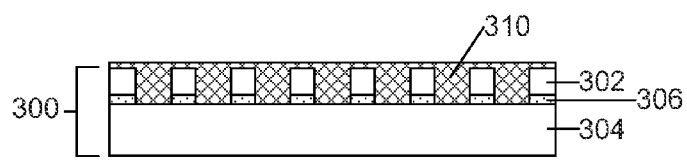
Figure 3G:
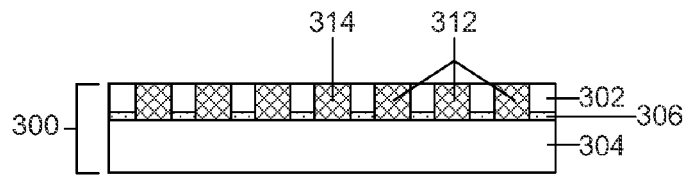

In various embodiments, photoresist layer 308 may be stripped as illustrated at FIG. 3E, and a metal layer 310 may be deposited, as illustrated at FIG. 3F. Metal layer 310 may be chemically and mechanically planarized, as illustrated at FIG. 3G, to form a substantially planar surface. Metal layer 310 thereby forms a plurality of lines 312 corresponding to the first subset and a plurality of islands 314 corresponding to the second subset.

Another method for forming high-density features in accordance with various embodiments of the present invention is illustrated at FIGS. 4A-4K. FIGUREs A-4K illustrate cross-sectional side views of a microelectronic device 400 after various operations associated with forming the high-density features.

Figure 4A:
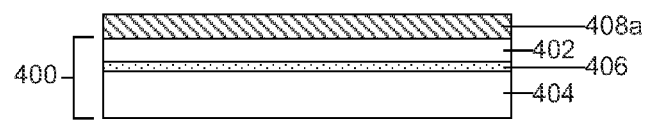
FIGS. 4A-4K illustrate various stages of another method for forming high-density features in accordance with various embodiments of the present invention.

As illustrated in FIG. 4A, a photoresist layer 408a may be formed over a dielectric layer 402, which may be disposed over an etch stop layer 406 and a substrate 404. As noted herein, any number of device layers may intervene the layers, depending on the application.

Figure 4B:
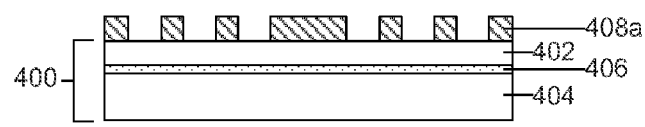

Photoresist layer 408a may be patterned with a first pattern configured to form a plurality of lines, as illustrated at FIG. 4B. Dielectric layer 402 may be revealed at locations corresponding to locations whereat the plurality of lines may be later formed. For example, the revealed portions may correspond to locations of lines 206 illustrated in FIGS. 2A and 2B.

Figure 4C:
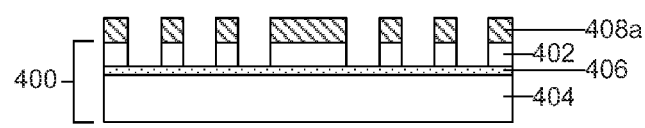
Figure 4D:
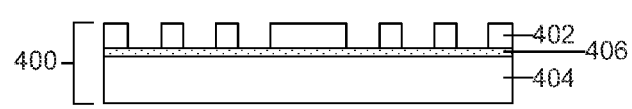

As illustrated in FIG. 4C, dielectric layer 402 may be etched at locations revealed by the first patterning to expose etch stop layer 406 at locations corresponding locations thereto. An ashing or stripping operation, or some another removal operation, (generally referred to herein as "stripping") may then be used for removing photoresist layer 408a as illustrated at FIG. 4D.

Figure 4E:
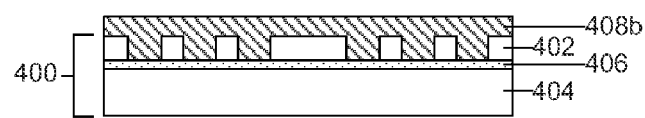
Figure 4F:
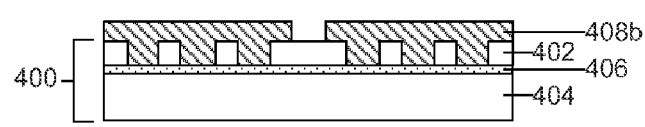

Another photoresist layer 408b may be formed over the patterned dielectric layer 402 as illustrated at FIG. 4E, and then patterned with a second pattern configured to form a plurality of islands, as illustrated at FIG. 4F. For example, the pattern may correspond to locations of islands 208 illustrated in FIGS. 2A and 2B.

In various other embodiments, photoresist layer 408a may be allowed to remain after etching dielectric layer 402, and the second patterning performed using the same photoresist layer 408a.

Figure 4G:
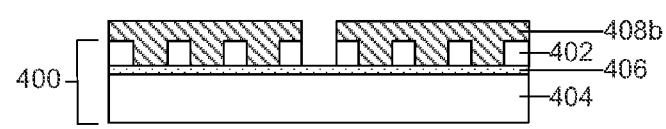

Dielectric layer 402 may be etched at locations revealed by the second patterning to expose etch stop layer 406 at locations corresponding thereto, as illustrated at FIG. 4G.

Figure 4H:
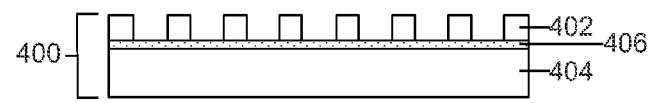
Figure 4I:
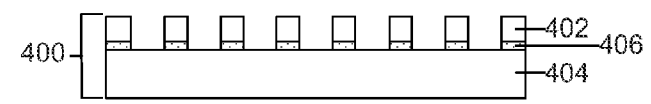
Figure 4J:
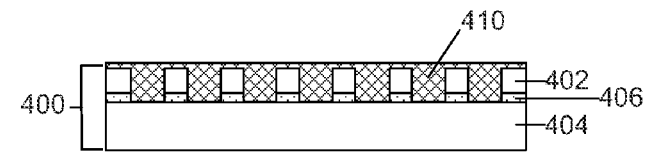
Figure 4K:
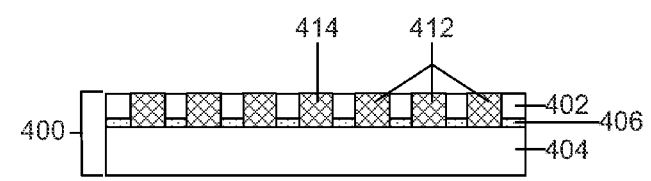

In various embodiments, photoresist layer 408b may be stripped and etch stop layer 406 removed at the revealed locations, as illustrated at FIG. 4H and FIG. 4I, respectively, and a metal layer 410 may be deposited, as illustrated at FIG. 4J. Metal layer 410 may be chemically and mechanically planarized, as illustrated at FIG. 4K, to form a substantially planar surface. Metal layer 410 thereby forms a plurality of lines 412 corresponding to the first pattern and a plurality of islands 414 corresponding to the second pattern.

Figure 5A:
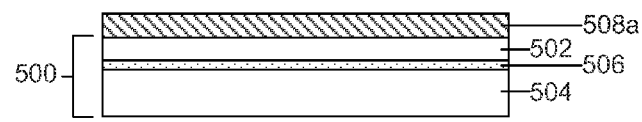
FIGS. 5A-5N illustrate various stages of another method for forming high-density features in accordance with various embodiments of the present invention.
Figure 5B:
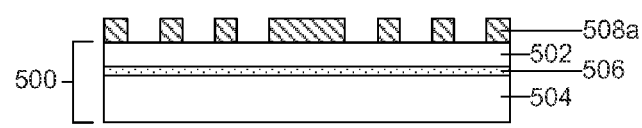
Figure 5C:
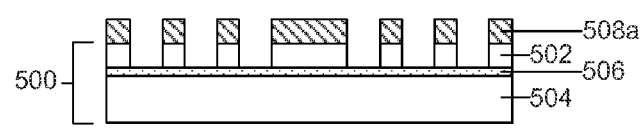
Figure 5D:
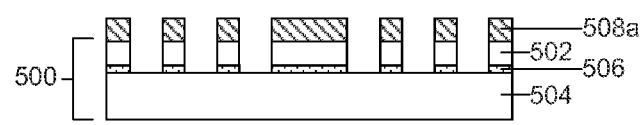
Figure 5E:
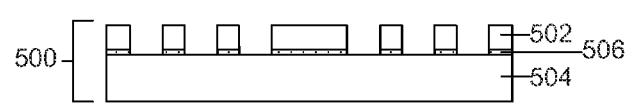
Figure 5F:
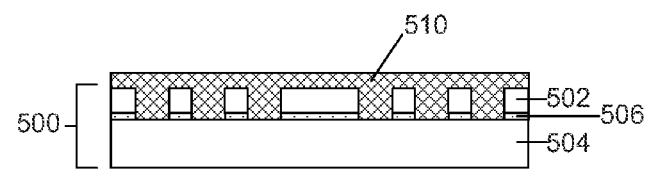
Figure 5G:
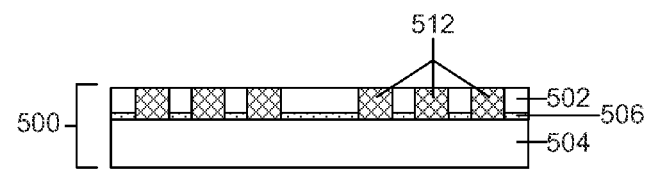
Figure 5H:
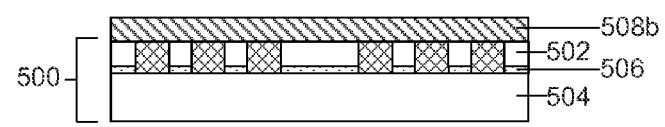
Figure 5I:
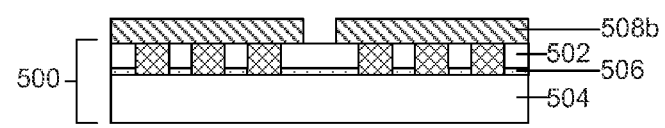
Figure 5J:
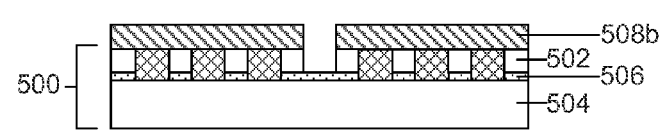
Figure 5K:
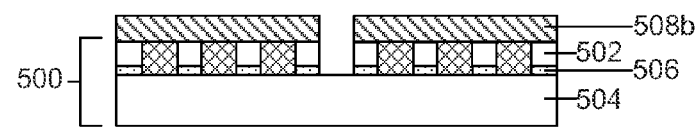
Figure 5L:
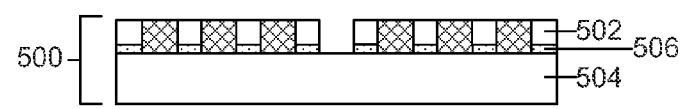
Figure 5M:
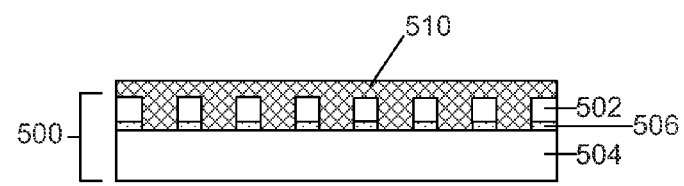
Figure 5N:
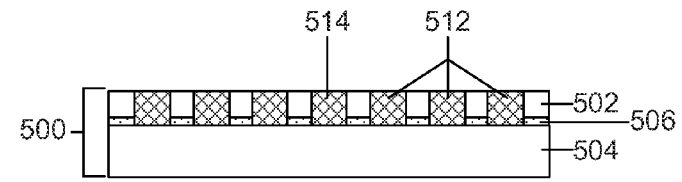

Still another method for forming high-density features in accordance with various embodiments of the present invention is illustrated at FIGS. 5A-5N. FIGS. 5A-5N illustrate cross-sectional side views of a microelectronic device 500 after various operations associated with forming the high-density features.

As illustrated in FIG. 5A, a photoresist layer 508a may be formed over a dielectric layer 502, which may be disposed over an etch stop layer 506 and a substrate 504. As noted herein, any number of device layers may intervene the layers, depending on the application.

Photoresist layer 508a may be patterned with a first pattern configured to form a plurality of lines, as illustrated at FIG. 5B. Dielectric layer 502 may be revealed at locations corresponding to locations whereat the plurality of lines may be later formed. For example, the revealed portions may correspond to locations of lines 206 illustrated in FIGS. 2A and 2B.

As illustrated in FIG. 5C, dielectric layer 502 may be etched at locations revealed by the first patterning to expose etch stop layer 506 at locations corresponding thereto. The exposed portions of etch stop layer 506 may then be removed as illustrated at FIG. 5D. Photoresist layer 508a may then be stripped as illustrated at FIG. 5E.

A metal layer 510 may be deposited, as illustrated at FIG. 5F. Metal layer 510 may be chemically and mechanically planarized, as illustrated at FIG. 5G, to form a substantially planar surface.

In various other embodiments, photoresist layer 508a may be allowed to remain after etching dielectric layer 502, with metal layer 510 being deposited, and the second patterning performed using the same photoresist layer 508a.

Another photoresist layer 508b may be formed over metal layer 510 and the patterned dielectric layer 502 as illustrated at FIG. 5H. Photoresist layer 508b may then be patterned with a second pattern configured to form a plurality of islands, as illustrated at FIG. 5I. For example, the pattern may correspond to locations of islands 208 illustrated in FIGS. 2A and 2B. Dielectric layer 502 may be etched at locations revealed by the second patterning to expose etch stop layer 506 at locations corresponding thereto, as illustrated at FIG. 5J. The exposed portions of etch stop layer 506 may then be removed as illustrated at FIG. 5K.

In various embodiments, photoresist layer 508 may be stripped, as illustrated at FIG. 5L, and additional metal may be deposited, as illustrated at FIG. 5M. Metal layer 510 may again be chemically and mechanically planarized, as illustrated at FIG. 5N, to form a substantially planar surface. Metal layer 510 thereby forms a plurality of lines 512 corresponding to the first pattern and a plurality of islands 514 corresponding to the second pattern.

According to various embodiments, the metal lines and islands formed using various methods described herein may be used for electrically interconnecting various device layers of a microelectronic device. High-density lines and islands may be particularly useful for memory applications. Memory cells are generally formed in dense arrays and thus may also require lines and island formed with a density difficult to achieve with various prior art methods.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   forming a dielectric layer;
   depositing a first photoresist layer over the dielectric layer;
   patterning the first photoresist layer with a first pattern;
   subsequent to patterning the first photoresist layer with the first pattern, etching first portions of the dielectric layer that are revealed by the first pattern in the first photoresist layer;
   subsequent to etching the first portions of the dielectric layer, removing the first photoresist layer;
   subsequent to removing the first photoresist layer, depositing a first metal layer over the dielectric layer;
   subsequent to depositing the first metal layer over the dielectric layer, depositing a second photoresist layer over each of (i) the first metal layer and (ii) the dielectric layer;
   patterning the second photoresist layer with a second pattern to reveal second portions of the dielectric layer, wherein third portions of the dielectric layer are not revealed by the second pattern in the second photoresist layer;
   subsequent to patterning the second photoresist layer with the second pattern, etching the second portions of the dielectric layer that are revealed by the second pattern in the second photoresist layer, wherein while the second portions of the dielectric layer are etched, the third portions of the dielectric layer are not etched;
   subsequent to etching the second portions of the dielectric layer, removing the second photoresist layer to expose the third portions of the dielectric layer;
   subsequent to removing the second photoresist layer, depositing a second metal layer directly over each of (i) the third portions of the dielectric layer and (ii) the first metal layer such that the second metal layer is in physical contact with each of (i) at least a section of the third portions of the dielectric layer and (ii) at least a section of the first metal layer; and
   subsequent to depositing the second metal layer over each of (i) the third portions of the dielectric layer and (ii) the first metal layer, planarizing the second metal layer to expose the third portions of the dielectric layer.

2. The method of claim 1, wherein:
   the patterning of the first photoresist layer with the first pattern comprises exposing the first photoresist layer using a first mask configured to pattern the first pattern; and
   the patterning of the second photoresist layer with the second pattern comprises exposing the second photoresist layer using a second mask configured to pattern the second pattern.

3. The method of claim 1, wherein:
   the patterning of the first photoresist layer with the first pattern comprises projecting a light onto the first photoresist layer in the first pattern; and
   the patterning of the second photoresist layer with the second pattern comprises projecting a light onto the second photoresist layer in the second pattern.

4. The method of claim 1, wherein:
   the first pattern comprises a plurality of islands; and
   the second pattern comprises a plurality of lines.

5. The method of claim 1, wherein:
   the dielectric layer is formed over a plurality of memory cells; and
   the plurality of memory cells are electrically coupled with (i) one or more of the plurality of islands or (ii) one or more of the plurality of lines.

6. The method of claim 1, wherein:
   etching the first portions of the dielectric layer further comprises forming a plurality of first openings in the dielectric layer at locations corresponding to the first pattern; and
   etching the second portions of the dielectric layer further comprises forming a plurality of second openings in the dielectric layer at locations corresponding to the second pattern.

7. The method of claim 1, further comprising:
subsequent to depositing the first metal layer over the dielectric layer, planarizing the first metal layer.

8. The method of claim 7, wherein the planarizing of the first metal layer is performed prior to patterning the second photoresist layer with the second pattern.

9. The method of claim 1, wherein depositing the second metal layer further comprises depositing the second metal layer such that the second metal layer is in contact with the first metal layer.

10. The method of claim 1, wherein:
the first metal layer defines a plurality of islands corresponding to the first pattern; and
the second metal layer defines a plurality of lines corresponding to the second pattern.

* * * * *